(12) United States Patent  (10) Patent No.: US 7,390,741 B2
Takigawa et al.  (45) Date of Patent: Jun. 24, 2008

(54) METHOD FOR FABRICATING SEMICONDUCTOR DEVICE

(75) Inventors: Yukio Takigawa, Kawasaki (JP);
Tamotsu Yamamoto, Kawasaki (JP);
Yoshiyuki Okura, Kawasaki (JP);
Takahiro Kono, Kawasaki (JP);
Tsutomu Hosoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/816,958

(22) Filed: Apr. 5, 2004

(65) Prior Publication Data

US 2005/0136661 A1 Jun. 23, 2005

(30) Foreign Application Priority Data

Dec. 22, 2003 (JP) ............................. 2003-425195

(51) Int. Cl.
*H01L 21/44* (2006.01)
(52) U.S. Cl. .................. 438/672; 438/637; 438/638; 438/673; 438/620
(58) Field of Classification Search ......... 438/618–622, 438/637–638, 672–673
See application file for complete search history.

(56) References Cited

U.S. PATENT DOCUMENTS 6,069,055 A * 5/2000 Ukeda et al. ................ 438/424
6,146,988 A * 11/2000 Ngo et al. .................... 438/618
6,472,755 B1 * 10/2002 Ngo et al. .................... 257/762
2002/0035762 A1 * 3/2002 Okuda et al. ................... 15/77
2003/0041968 A1 * 3/2003 Saito et al. ............. 156/345.12
2004/0129569 A1 * 7/2004 Nabeya et al. ................ 205/93
2004/0168705 A1 * 9/2004 Sun et al. ..................... 134/1.2
2004/0219795 A1 * 11/2004 Li et al. ....................... 438/709

FOREIGN PATENT DOCUMENTS

| JP | 2002323476 | 11/2000 |
|---|---|---|
| JP | 2001053076 | 2/2001 |
| JP | 2001176878 | 6/2001 |
| JP | 2002246391 | 8/2002 |
| JP | 2003142580 | 5/2003 |

* cited by examiner

*Primary Examiner*—Dung A. Le
(74) *Attorney, Agent, or Firm*—Westerman, Hattori, Daniels & Adrain, LLP.

(57) ABSTRACT

A method for fabricating a semiconductor device comprises the steps of: forming interconnection grooves 38 in an interlayer insulation film 34; forming an interconnection layer 44 of Cu as the main material in the interconnection grooves 38; and concurrently injecting nitrogen gas and water to the surface of the interconnection layer 44 buried in the interconnection groove 38.

10 Claims, 12 Drawing Sheets

METHOD FOR FABRICATING SEMICONDUCTOR DEVICE

CROSS-REFERENCE TO RELATED APPLICATION

This application is based upon and claims priority of Japanese Patent Application No. 2003-425195, filed on Dec. 22, 2003, the contents being incorporated herein by reference.

BACKGROUND OF THE INVENTION

The present invention relates to a method for fabricating a semiconductor device, more specifically a method for fabricating a semiconductor device including a multilayer interconnection structure using copper as the main material of the interconnection layers.

As semiconductor devices have been larger scaled and higher integrated, the design rule of the interconnections have been reduced with the generations. Conventionally, the interconnection layers have been formed by depositing interconnection materials and patterning the deposited interconnection materials using lithography and dry etching, but technical limitations in this process commences to arise as the generation has advanced. As a new process for forming the interconnection layers, which takes over the conventional interconnection forming process, the process, the so-called damascene process, of forming a groove pattern and a hole pattern in an inter-layer insulation film and burying an interconnection material in the grooves and the holes, is being used. With the shift in the interconnection forming process, copper (Cu), which has specific resistance lower than aluminum conventionally used as the interconnection material and has superior electro-migration resistance, has come into use.

Semiconductor devices of the multilayer interconnection structure including semiconductor elements, such as transistors, etc., highly integrated by such interconnection forming process is rapidly being developed. Coupled with this, processes of improving the reliability of semiconductor devices by suppressing electro-migration in the interconnection layers or other means have been so far reported (refer to, e.g., Japanese Patent Application Unexamined Publication No. 2000-323476, Japanese Patent Application Unexamined Publication No. 2002-246391 and Japanese Patent Application Unexamined Publication No. 2003-142580).

In operation of a semiconductor device, the device itself generates heat, and its temperature rises. It has been conventionally known that when the multilayer interconnection structure is exposed to high temperature environment due to such temperature rise in operation and the processes following the formation of the multilayer interconnection structure, etc., Cu atoms in the interconnection layers and pores formed in the interconnection layers migrate, forming large voids in the interconnection layers, and these voids causes conduction defects of the interconnection layers.

In the generation where widths of the interconnection layers were 1 μm or more, the widths of the interconnection layers were large enough for sizes of the voids generated in the interconnection layers. Accordingly, the conduction defects due to the voids did not much affect the operation characteristics and reliability of semiconductor devices.

However, in the generation where widths of the interconnection layers is 0.5 μm or less, the influences of the interconnection resistance increase due to voids generated in the interconnection layers on the operation characteristics and reliability of semiconductor devices becomes unignorable. Especially in forming hereafter fine interconnection layers of 0.2 μm or less widths, it is essential to suppress the generation of conduction defects due to the voids.

The above-mentioned Japanese Patent Application Unexamined Publications disclose methods for the purpose of increasing the reliability of semiconductor devices. However, these methods increase the reliability by increasing the resistance to the electro-migration in the interconnection layers. So far, sufficient measures to the conduction defects of the interconnection layers due to voids generated in the interconnection layers left at high temperatures have not been made.

SUMMARY OF THE INVENTION

An object of the present invention is to provide a method for fabricating a semiconductor device which suppresses the generation of voids in the interconnection layers in high temperature environments to thereby suppress the conduction defects of the interconnection layers, whereby the reliability of semiconductor devices having multilayer interconnection structures can be increased.

According to one aspect of the present invention, there is provided a method for fabricating a semiconductor device comprising the steps of: forming an opening in an insulation film; forming an interconnection layer of Cu as a main material in the opening; and concurrently injecting nitrogen gas and water to the surface of the interconnection layer buried in the opening.

According to the present invention, the method for fabricating a semiconductor device according to the present invention comprises the steps of: forming an opening in an insulation film; forming an interconnection layer of Cu as the main material in the opening; and concurrently injecting nitrogen gas and water to the surface of the interconnection layer buried in the opening, whereby the migration of the Cu atoms of the interconnection layer in high temperature environments is suppressed, and the generation rate of conduction defects of the interconnection layer can be decreased. Thus, the semiconductor devices having multilayer interconnection layers of good stress-migration resistance and high reliability can be provided.

The method for fabricating a semiconductor device according to the present invention further comprises the step of applying hydrogen plasmas to the surface of the insulation film and the surface of the interconnection layer after the step of concurrently injecting nitrogen gas and water, whereby the surface of the insulation film and the surface of the interconnection layer can be cleaned, and the diffusion preventing film for preventing the diffusion of the Cu as the interconnection material can be formed on the insulation film and the interconnection layer with high adhesion. Thus, semiconductor devices of high reliability can be provided.

DETAILED DESCRIPTION OF THE INVENTION

Figure 1:
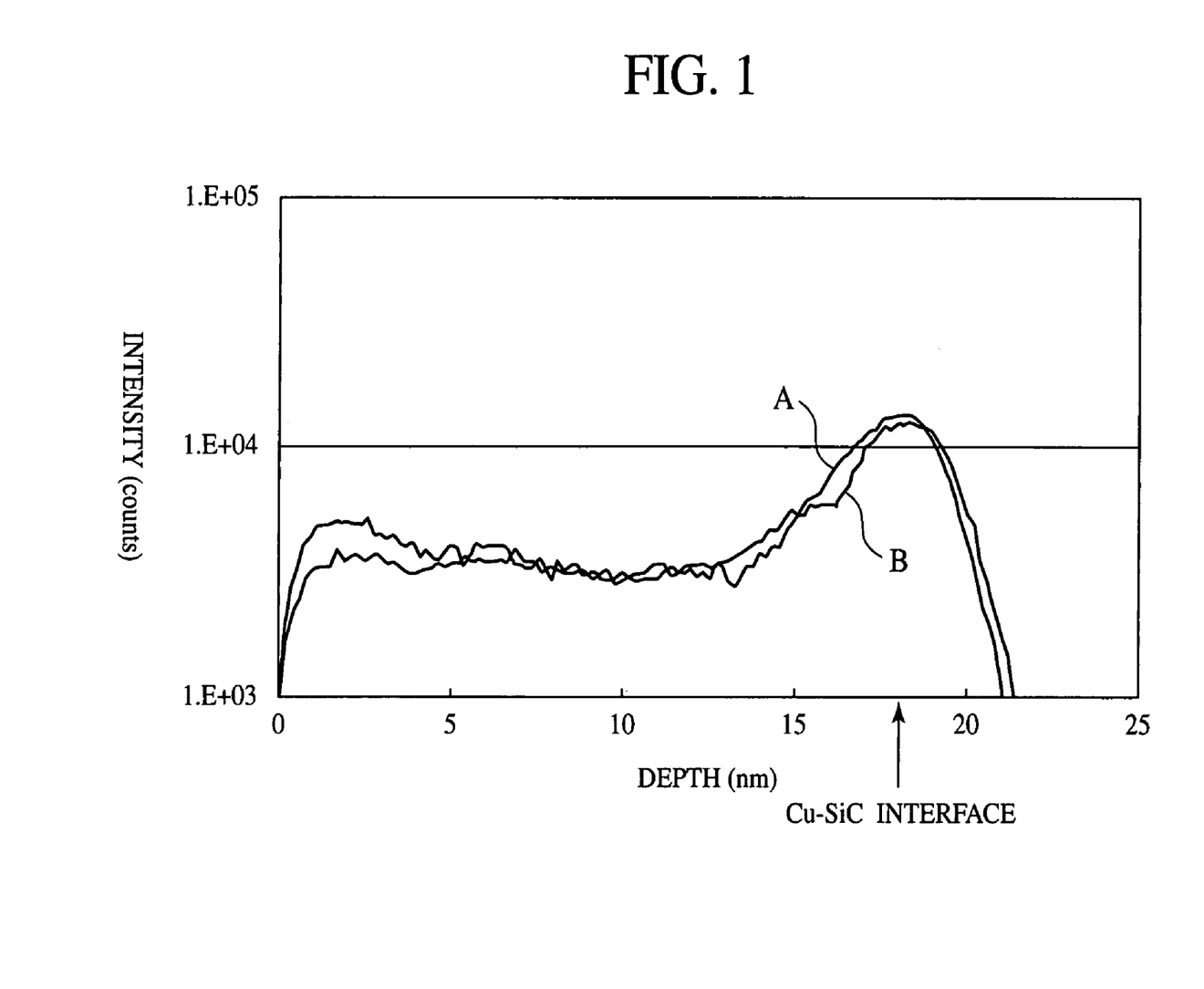
FIG. 1 is a graph of results of the secondary ion mass spectroscopic analysis of the surface after a diffusion preventing film has been formed on an interconnection layer.
Figure 2:
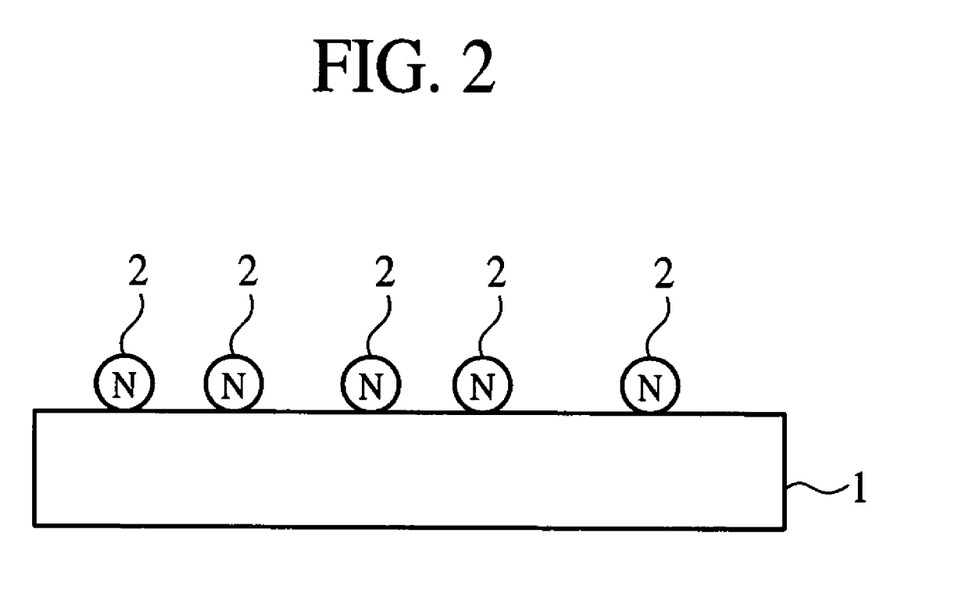
FIG. 2 is a diagrammatic view explaining the mechanism for suppressing the generation of voids by the method for fabricating a semiconductor device according to the present invention.
Figure 3:
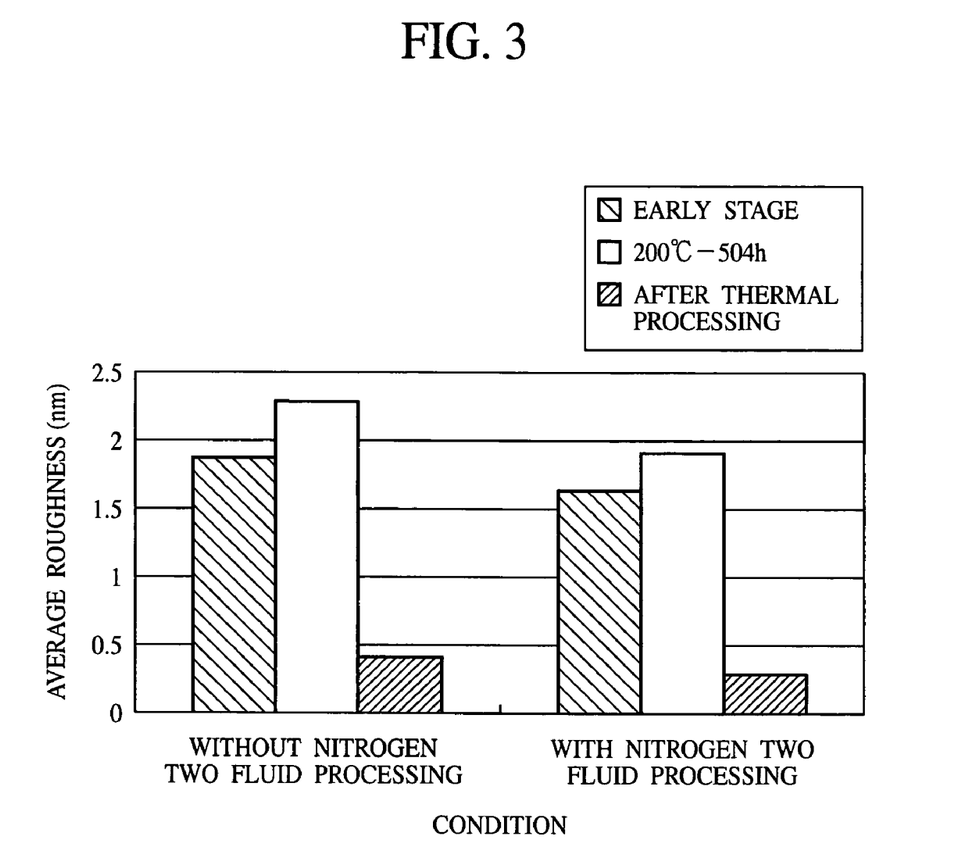
FIG. 3 is a graph of results of the measurement of surface roughness of diffusion preventing films formed on interconnection layers (Part 1).
Figure 4:
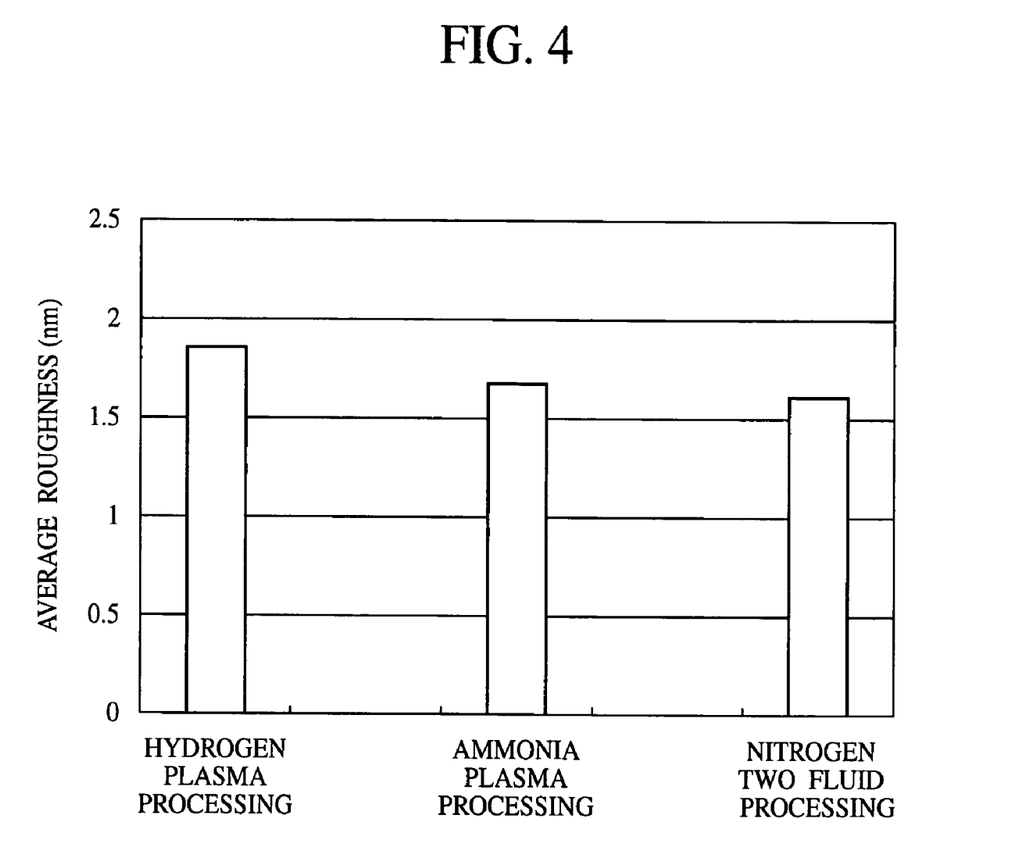
FIG. 4 is a graph of results of the measurement of the surface roughness of diffusion preventing films formed on interconnection layers (Part 2).

First, the principle of the method for fabricating a semiconductor device according to the present invention will be explained with reference to FIGS. 1 to 4. FIG. 1 is a graph of results of the secondary ion mass spectroscopic analysis of the surface of an interconnection layer with a diffusion preventing film formed on. FIG. 2 is a diagrammatic view explaining the mechanism for suppressing the generation of voids by the method for fabricating semiconductor device according to the present invention. FIGS. 3 and 4 are graphs of results of the measurement of surface roughness of the diffusion preventing film formed on the interconnection layer.

The method for fabricating a semiconductor device according to the present invention is characterized mainly by comprising the step of forming an opening in an insulation film, the step of forming an interconnection layer of Cu as the main material in the opening, and the step of concurrently injecting nitrogen gas and water to the surface of the interconnection layer buried in the opening. In this specification, the processing of concurrently injecting nitrogen gas and water is called "nitrogen-two-fluid processing."

The surface of an interconnection layer of Cu as the main material, which was exposed after flattening by CMP (Chemical Mechanical Polishing) in the damascene process is formed of substantially pure Cu. Conventionally, immediately after flattening by CMP, the diffusion preventing film of SiC or others for preventing the diffusion of Cu which is the interconnection layer material has been formed. When a multilayer interconnection formed by such conventional steps is exposed to high temperature environments, Cu atoms of the interconnection material and pores in the interconnection layers migrate and resultantly voids generates in the interconnection layers. Such voids are one of the causes for the conduction defect of the interconnection layers.

On the other hand, the inventors of the present invention have found that after an interconnection layer is buried in an interconnection groove of an inter-layer insulation film and is flattened by CMP and before a diffusion preventing film for preventing the diffusion of Cu as the interconnection material is formed, nitrogen-two-fluid processing of concurrently injecting nitrogen gas and water to the surface of the interconnection layer is performed, whereby even when a multi-layer interconnection is exposed to an environment of high temperature, the rate of generating conduction defects of the interconnection layers becomes exceedingly low.

FIG. 1 is a graph of the results of secondary ion mass spectroscopic analysis of a vicinity of the surface of a semiconductor device having an interconnection layer of Cu as the main material by the damascene process, and an SiC film as a diffusion preventing film formed on an inter-layer insulation film with the interconnection layer buried in. The depth profile A of FIG. 1 shows the result of the case in which an interconnection layer was formed, and then an SiC film was formed on the inter-layer insulation film with the interconnection layer buried in which has been subjected to the nitrogen-two-fluid processing. The depth profile B shows the result of the case in which an SiC film was formed, without the nitrogen-two-fluid processing, on an inter-layer insulation with an interconnection layer buried in immediately after the interconnection layer has been formed.

Based on the result of the secondary ion mass spectroscopic analysis shown FIG. 1, it is comprehensible that when the nitrogen-two-fluid processing was performed, nitrogen is detected near the interface between the interconnection layer of Cu as the main material and the SiC film, although a little. Based on this result, when the nitrogen-two-fluid processing is performed, as shown in FIG. 2, it is considered that nitrogen 2 is adsorbed on the surface of the interconnection layer 1 of Cu as the main material. FIG. 2 is a diagrammatic view of the nitrogen adsorbed onto the surface of the interconnection layer.

As described above, it is possible that nitrogen is adsorbed onto the surface of the interconnection layer of Cu as the main material by nitrogen-two-fluid processing, and the rate of generating the conduction defect of the interconnection layer is controlled low by the following mechanism even in high temperature environments. That is, when the diffusion preventing film for preventing the diffusion of Cu is formed with nitrogen adsorbed onto the surface of the interconnection layer of Cu as the main material, the presence of the nitrogen makes it difficult the migration of the Cu atoms in the interconnection layer in high temperature environments. It is considered that resultantly, the generation of voids in the interconnection layer is suppressed, the rate of generating the conduction defects of the interconnection layer is suppressed low, and the stress-migration resistance of the interconnection layer is increased.

It is also possible that the water injected by the nitrogen-two-fluid processing contributes to the suppression of the generation of conduction defects in high temperature environments. That is, the water injected to the surface of the interconnection layer not only cleans the surface, but also bonds the hydroxyl groups present on the surface of the interconnection layer of Cu as the main material with hydrogen groups of the diffusion preventing film of SiC. This permits the diffusion preventing film to be formed on the interconnection layer with high adhesion, whereby the migration of the Cu atoms in the interconnection layer becomes difficult even in high temperature environments. It is considered that resultantly, the generation of voids in the interconnection layer is suppressed, whereby the rate of generating conduction defects of the interconnection layer is suppressed low, and the stress-migration resistance of the interconnection layer is increased.

It is confirmed, based on the results of the measurement of the average roughness of the diffusion preventing film formed on the interconnection layer, which are shown in FIGS. 3 and 4 that the migration of the Cu atoms in the interconnection layer in high temperature environments is suppressed by the nitrogen-two-fluid processing.

FIG. 3 is a graph of results of the measurement of the average roughness of the surface of an SiC film formed on an inter-layer insulation film with an interconnection layer buried in by the damascene process. The average surface roughness of SiC films formed with the nitrogen-two-fluid processing and without the nitrogen-two-fluid processing was measured at the early stage following the deposition, after left for 504 hours at 200° C. and at the early stage following thermal processing. The average surface roughness was measured with an atomic force microscope.

Based on the graph shown FIG. 3, it is seen that with the nitrogen-two-fluid processing, the average surface roughness is generally smaller, and the change amount of the average surface roughness by the thermal processing is suppressed lower than without the nitrogen-two-fluid processing. Based on the results that the change amount of the average surface roughness of the diffusion preventing film formed on the interconnection layer is suppressed low, it can be said that the nitrogen-two-fluid processing makes the migration of the Cu atoms of the interconnection layer due to thermal processing difficult, and the generation of voids in the interconnection layer is suppressed.

FIG. 4 is a graph which compares the average surface roughness of SiC films formed on inter-layer insulation films with interconnection layers buried in by the damascene process, with the nitrogen-two-fluid processing and with other processing in place of the nitrogen-two-fluid processing; the average surface roughness was measured with the nitrogen-two-fluid processing, with hydrogen plasma processing and with ammonia plasma processing. In all the cases, the SiC films were not subjected to any processing, such as thermal processing, etc., after the deposition. The average surface roughness was measured with an atomic force microscope.

Based on the graph shown in FIG. 4, it is seen that the average surface roughness of the SiC film with the nitrogen-two-fluid processing is lower than with the hydrogen plasma processing and with the ammonia plasma processing.

As described above, in the method for fabricating a semiconductor device according to the present invention, an interconnection layer of Cu as the main material is buried in an interconnection groove and is flattened by CMP, and then the nitrogen-two-fluid processing is performed before a diffusion preventing film is formed, whereby the migration of Cu atoms in the interconnection layer in high temperature environments is suppressed, and the generation of voids in the interconnection layer is suppressed. The method for fabricating a semiconductor device according to the present invention can fabricate a semiconductor device having good stress-migration resistance of the interconnection layers and having high reliability.

Processing conditions, etc., of the nitrogen-two-fluid processing used in the method for fabricating a semiconductor device according to the present invention will be detailed below.

A spray system for concurrently injecting nitrogen gas and water in the nitrogen-two-fluid processing can be, e.g., a nitrogen-two-fluid spray, such as a soft spray, a nano-spray or others by DAINIPPON SCREEN MFG. CO., LTD, a nitrogen-two-fluid spray by TOSHIBA MECHATRONICS CO., LTD., or others.

The water to be injected in the nitrogen-two-fluid processing may have the purity which is usable in the semiconductor fabrication process, and deionized water or others can be used. Water may be pure water having, e.g., a specific resistance of 18.2 MΩ·cm or more and a containing content of particles at the level of several particles/mL of a below 0.5 μm particle diameter excluding 0.5 μm. Carbonated water having carbon dioxide dissolved in such water may be used. Carbonated water is said to have the effect of suppressing the generation of static electricity. Other than carbonated water, ozonized water having ozone dissolved in water, hydrogen functional water containing a prescribed concentration of hydrogen ions, etc. may be used. Ozonized water and hydrogen functional water are effective to remove organic contaminants and metal contaminants staying on the surface of the substrate. The flow rate of the water to be injected in the nitrogen-two-fluid processing can be suitably set at a prescribed value and can be set at, e.g., 50-300 mL/min.

The flow rate of the nitrogen gas to be injected in the nitrogen-two-fluid processing can be suitably set at a prescribed value, e.g., at 5-200 L/min, more preferably 30-100 L/min. This is because there is a risk that when the flow rate is too small, the nitrogen-two-fluid processing will not sufficiently produce its effect, and, on the other hand, will cause pattern collapse when the flow rate is too large.

The period of time of injecting nitrogen gas and water in the nitrogen-two-fluid processing can be also suitably set, depending on conditions, such as a kind of the water to be injected, a flow rate of the water, a flow rate of the nitrogen gas, etc., e.g., at about 5-300 sec.

The method for fabricating a semiconductor device according to the present invention is also characterized in that hydrogen plasma processing of applying hydrogen plasmas to the surface of an inter-layer insulation film with an interconnection layer buried in is performed after the above-described nitrogen-two-fluid processing and before the formation of a diffusion preventing film. The hydrogen plasma processing purifies the surface, and accordingly the diffusion preventing film can be formed with high adhesion. Thus, the semiconductor device can have the increased reliability. The results of the secondary ion mass spectroscopic analysis shown in FIG. 1 of the vicinities of the surfaces subjected to the hydrogen plasma processing after the nitrogen-two-fluid processing. Based on the results, the nitrogen adsorbed onto the surface of the interconnection layers by the nitrogen-two-fluid processing still remains even after subjected to the hydrogen plasma processing.

The method for fabricating a semiconductor device according to one embodiment of the present invention will be explained with reference to FIGS. 5A-5D, 6A-6C, 7A-7C, 8A-8B, 9A-9B, 10A-10B, 11A-11B and 12A-12B. FIGS. 5A-5D, 6A-6C, 7A-7C, 8A-8B, 9A-9B, 10A-10B, 11A-11B and 12A-12B are sectional views of a semiconductor device in the steps of the method for fabricating the semiconductor device according to the present embodiment.

Figure 5A:
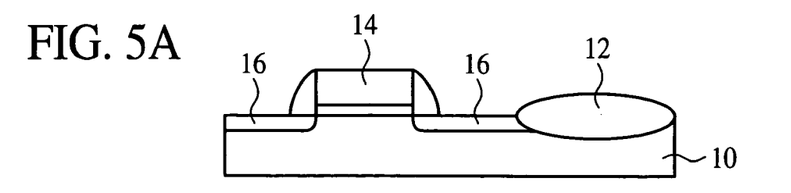
FIGS. 5A-5D are sectional views of the semiconductor device in the steps of the method for fabricating the semiconductor device according to one embodiment of the present invention (Part 1).

First, in the same way as in, e.g., the usual MOS transistor fabricating method, a MOS transistor including a gate electrode 14 and a source/drain diffused layers 16 is formed on a silicon substrate 10 with a device isolation film 12 formed on (see FIG. 5A). Various semiconductor devices other than MOS transistors can be fabricated on the semiconductor substrate 10.

Then, a silicon nitride film 18 of, e.g., a 0.1 μm-thickness is formed by, e.g., CVD (Chemical Vapor Deposition) on the silicon substrate 10 with the MOS transistor formed on.

Next, a PSG (Phosphorous Silicate Glass) film 20 of, e.g., a 1.5 μm-thickness is formed on the silicon nitride film 18 by, e.g., CVD. The substrate temperature for the deposition of the PSG film 20 is set at, e.g., 600° C.

Then, the surface of the PSG film 20 is polished by, e.g., CMP until the film thickness of the PSG film 20 becomes, e.g., 200 nm to thereby flatten the surface of the PSG film 20.

Figure 5B:
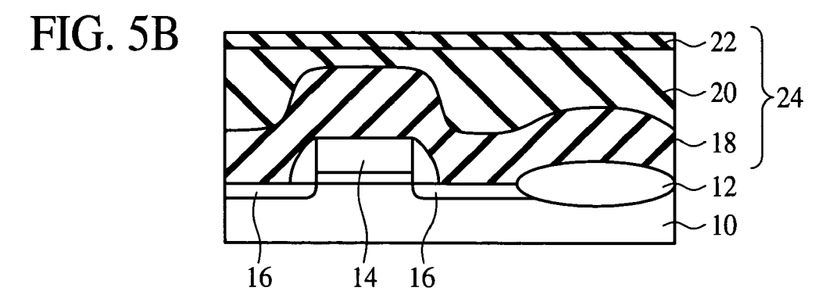

Next, an SiC film 22 of, e.g., a 50 nm-thickness is formed on the PSG film 20 by, e.g., CVD (see FIG. 5B). The SiC film 22 functions as a passivation film.

Thus, an inter-layer insulation film 24 is formed of the silicon nitride film 18, the PSG film 20 and the SiC film 22 laid the latter on the former.

Next, a contact hole 26 is formed in the SiC film 22, the PSG film 20 and the silicon nitride film 18 down to the silicon substrate 10 by photolithography and dry etching.

Then, a Ti (titanium) film of, e.g., a 15 nm-thickness, a TiN (titanium nitride) film of, e.g., a 15 nm-thickness and a W (tungsten) film of, e.g., a 300 nm-thickness are formed sequentially on the entire surface by, e.g., CVD.

Next, the W film, the TiN film and the Ti film are polished by, e.g., CMP until the surface of the inter-layer insulation film 24 is exposed to thereby remove the W film, the TiN film and the Ti film on the inter-layer insulation film 24. Thus, a contact plug 28 of the Ti film, the TiN film and the W film is formed, buried in the contact hole 26 (see FIG. 5C).

Figure 5C:
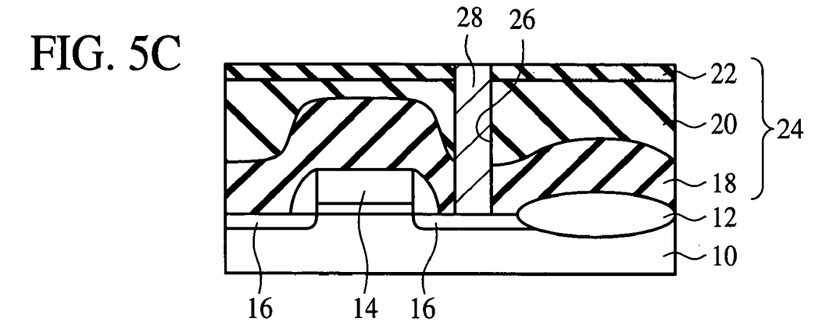

Then, an SiOC film 30 of, e.g., a 150 nm-thickness is formed by, e.g., plasma CVD on the SiC film 22 of the inter-layer insulation film 24 with the contact plug 28 buried in.

Then, a silicon oxide film 32 of, e.g., a 100 nm-thickness is formed on the SiOC film 30 by, e.g., plasma CVD.

Figure 5D:
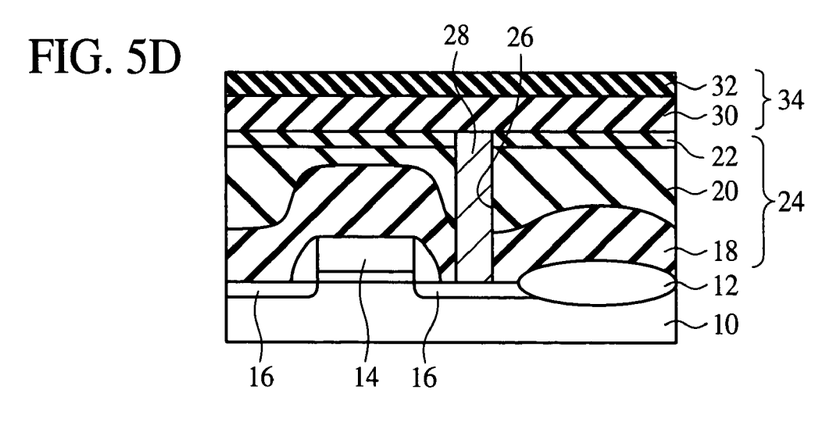

Thus, an inter-layer insulation film 34 of the SiOC film 30 and the silicon oxide film 32 laid the latter on the former on the SiC film 22 (see FIG. 5D).

Figure 6A:
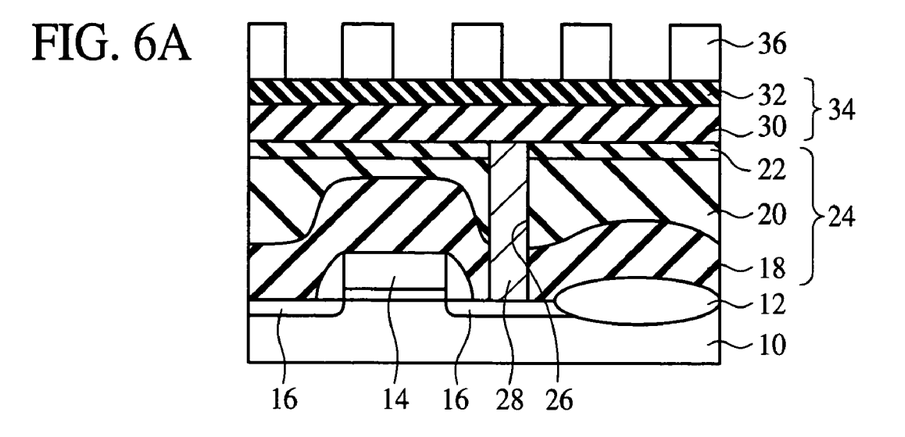
FIGS. 6A-6C are sectional views of the semiconductor device in the steps of the method for fabricating the semiconductor device according to the embodiment of the present invention (Part 2).

Next, a photoresist film 36 for exposing regions of the inter-layer insulation film 34 for interconnection grooves to be formed in is formed (see FIG. 6A).

Then, with the photoresist film 36 as a mask and the SiC film 22 as a stopper, the silicon oxide film 32 and the SiOC film 30 are sequentially etched. Thus, the interconnection grooves (trenches) 38 are formed in the silicon oxide film 32 and the SiOC film 30. After the interconnection grooves 38 have been formed, the photoresist film 36 used as the mask is removed (see FIG. 6B).

Figure 6B:
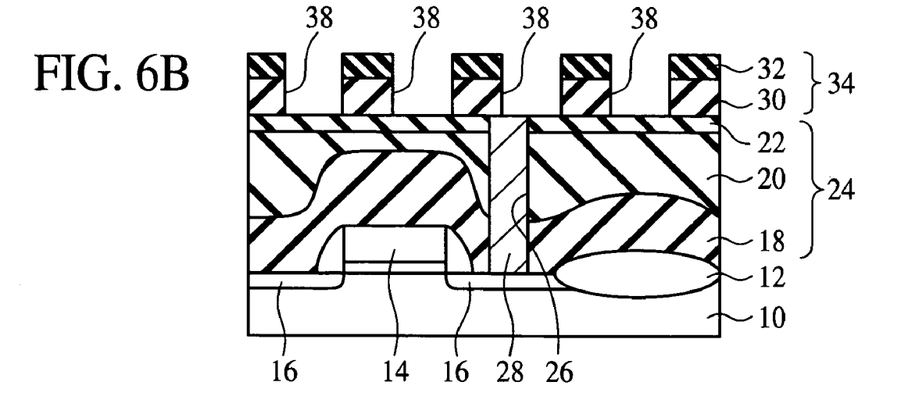

Next, a barrier metal layer 40 of a TaN (tantalum nitride) film of, e.g., a 30 nm-thickness and a Cu film of, e.g., a 30 nm-thickness are continuously deposited on the entire surface by, e.g., sputtering.

Figure 6C:
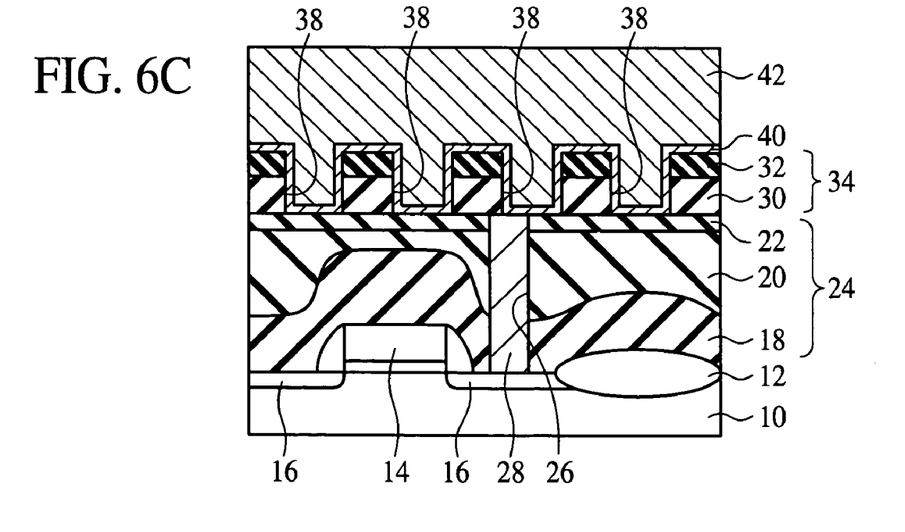

Then, with the Cu film formed on the barrier metal layer 40 as a seed, a Cu film is further deposited by electrolytic plating to form a Cu film 42 of, e.g., a 1 μm-total thickness (see FIG. 6C).

Next, the Cu film 42 and the barrier metal layer 40 are polished by CMP until the silicon oxide film 32 is exposed to remove the Cu film 42 and the barrier metal layer 40 on the silicon oxide film 32. Thus, an interconnection layer 44 is formed of the barrier metal layer 40 of the TaN film for preventing the diffusion of the Cu and the Cu film 42 forming the major part of the interconnection layer which are buried in the interconnection grooves 38 (see FIG. 7A).

After the interconnection layer 44 has been buried in by CMP, the nitrogen-two-fluid processing of concurrently injecting nitrogen gas and water to the surface of the inter-layer insulation film 34 and the surface of the interconnection layer 44 is performed. In the nitrogen-two-fluid processing, nitrogen gas and water are concurrently injected to the surface of the inter-layer insulation film 34 and the surface of the interconnection layer 44 through, e.g., a nozzle 46 of a spray apparatus disposed near the surface of the inter-layer insulation film 34 and the surface of the interconnection layer 44 (see FIG. 7B). At this time, the position of the nozzle 46 is suitably displaced to thereby inject the nitrogen gas and the water at respective locations. Otherwise, the nitrogen gas and the water are injected while the nozzle 46 is being suitably displaced. Thus, the nitrogen gas and the water are injected homogeneously to all the surface of the interconnection layer 44 buried in the interconnection grooves 38. The nitrogen-two-fluid processing can suppress the migration of the Cu atoms of the interconnection layer 44 when the semiconductor device is exposed to high temperature environments, and the generation of voids in the interconnection layer 44 can be suppressed. Resultantly, the generation of conduction defects of the interconnection layer 44 can be suppressed.

Figure 7A:
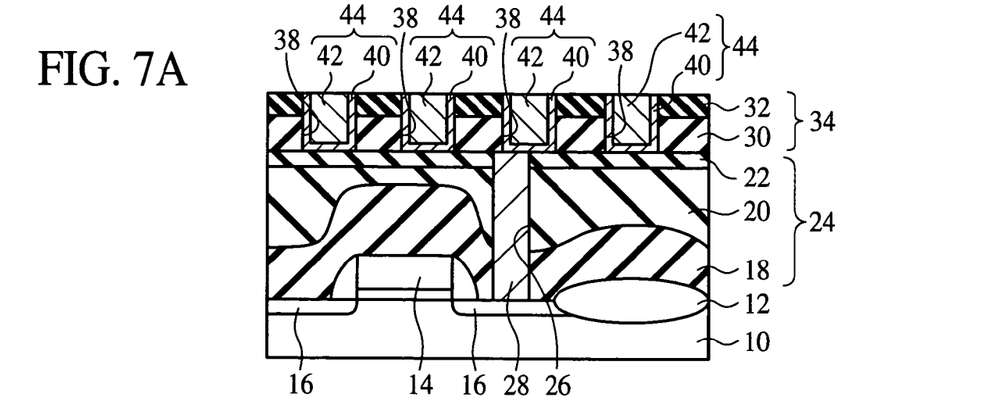
FIGS. 7A-7C are sectional views of the semiconductor device in the steps of the method for fabricating the semiconductor device according to the embodiment of the present invention (Part 3).
Figure 7B:
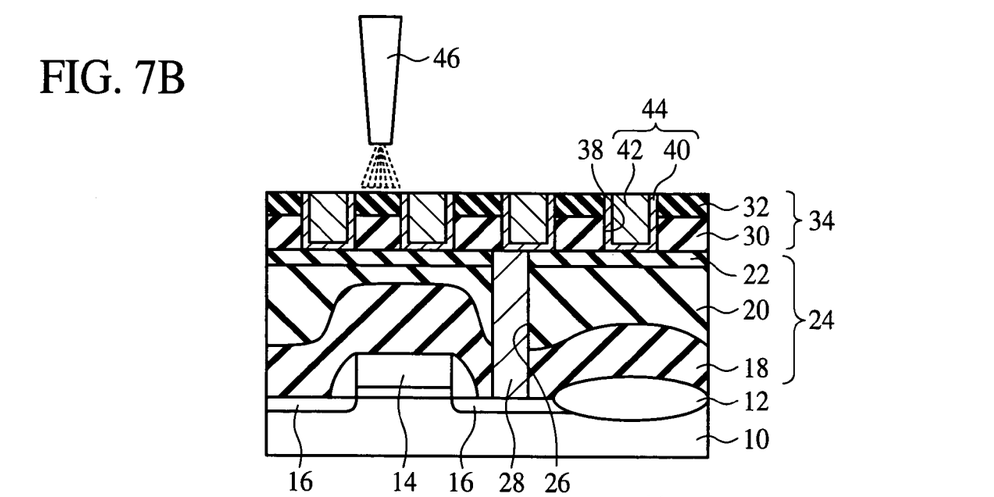

After the nitrogen-two-fluid processing, hydrogen plasmas are applied to the surface of the inter-layer insulation film 34 and the surface of the interconnection layer 44. The application of the hydrogen plasmas purifies the surface of the inter-layer insulation film 34 and the surface of the interconnection layer 44, and the diffusion preventing film can be formed on the inter-layer insulation film 34 and the interconnection layer 44 with high adhesion. Thus, the semiconductor device can have increased reliability.

Figure 7C:
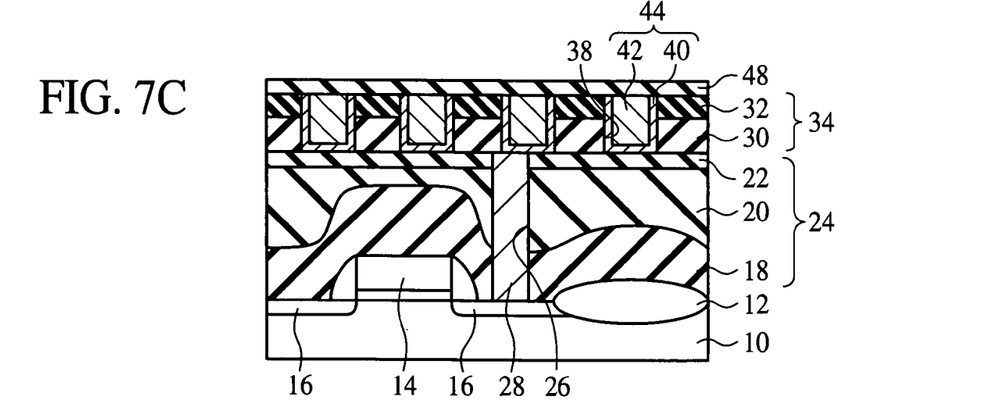

After the application of hydrogen plasmas, an SiC film 48 of, e.g., a 50 nm-thickness is formed on the interconnection layer 34 and the interconnection layer 44 by, e.g., plasma CVD (FIG. 7C). The SiC film 48 functions as the diffusion preventing film for preventing the diffusion of the Cu forming the interconnection layer.

Next, an SiOC film 54 of, e.g., a 450 nm-thickness is formed on the SiC film 48 by, e.g., plasma CVD.

Then, a silicon oxide film 56 of, e.g., a 100 nm-thickness is formed on the SiOC film 54 by, e.g., plasma CVD.

Next, a silicon nitride film 58 of, e.g., a 50 nm-thickness is formed on the silicon oxide film 56 by, e.g., plasma CVD.

Figure 8A:
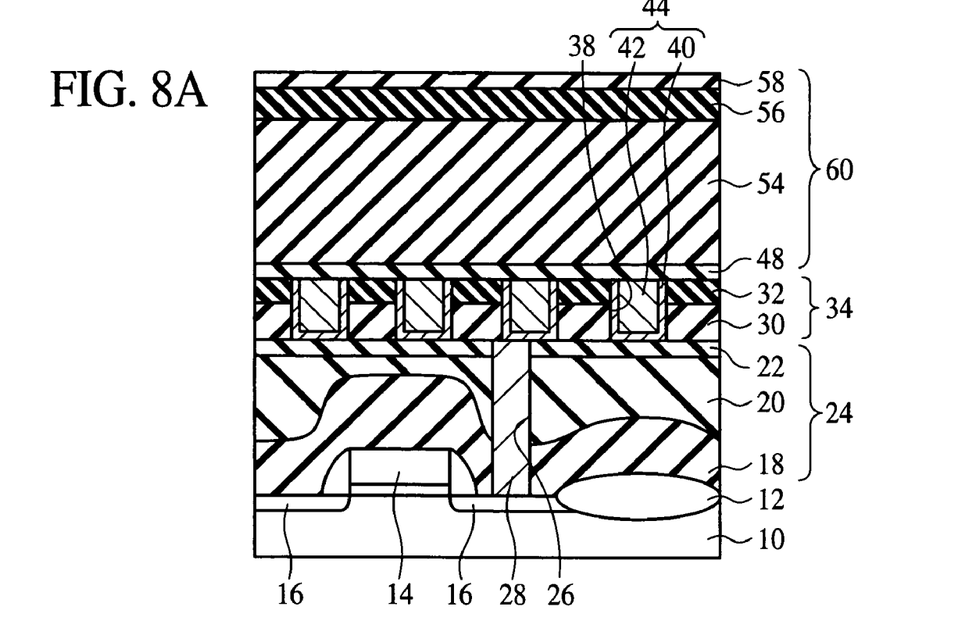
FIGS. 8A-8B are sectional views of the semiconductor device in the steps of the method for fabricating the semiconductor device according to the embodiment of the present invention (Part 4).
Figure 8B:
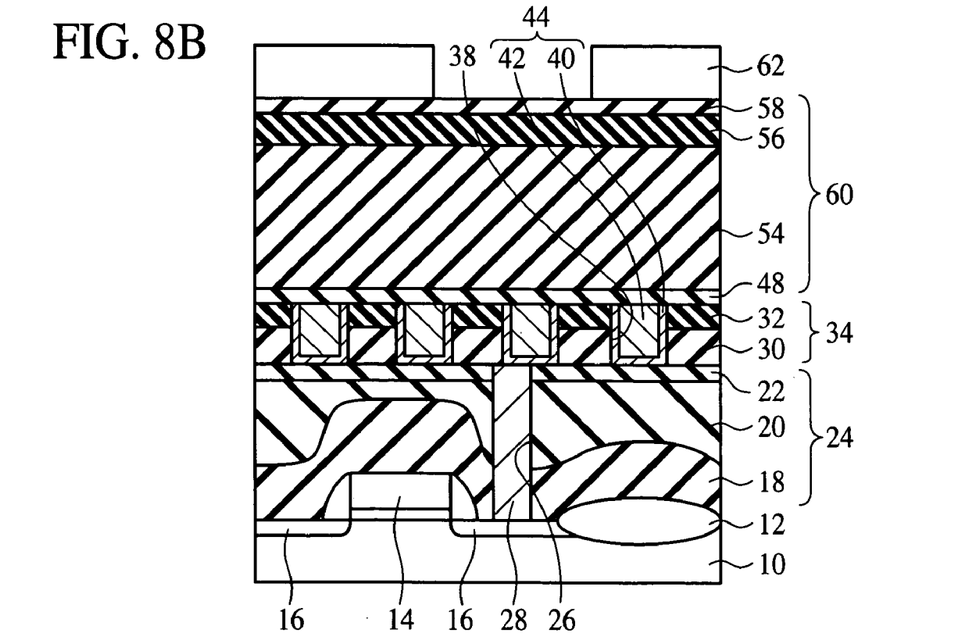

Thus, an inter-layer insulation film 60 of the SiC film 48, the SiOC film 54, the silicon oxide film 56 and the silicon nitride film 58 sequentially laid the latter on the former is formed on the inter-layer insulation film 34 with the interconnection layer 44 buried in the interconnection grooves 38 (see FIG. 8A).

Figure 9A:
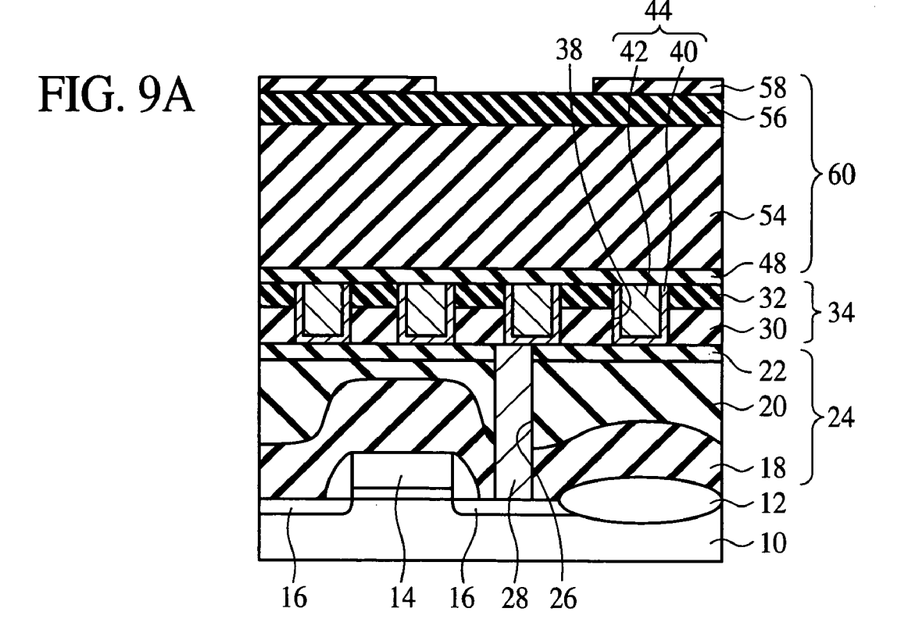
FIGS. 9A-9B are sectional views of the semiconductor device in the steps of the method for fabricating the semiconductor device according to the embodiment of the present invention (Part 5).

Then, a photoresist film 62 for exposing a region for an interconnection layer to be formed in the silicon oxide film 56 and the SiOC film 58 is formed on the silicon nitride film 58 by photolithography (see FIG. 9A).

Next, with the photoresist film 62 as a mask, the silicon nitride film 58 is anisotropically etched. After the silicon nitride film 58 has been etched, the photoresist film 62 used as the mask is removed (see FIG. 9A).

Figure 9B:
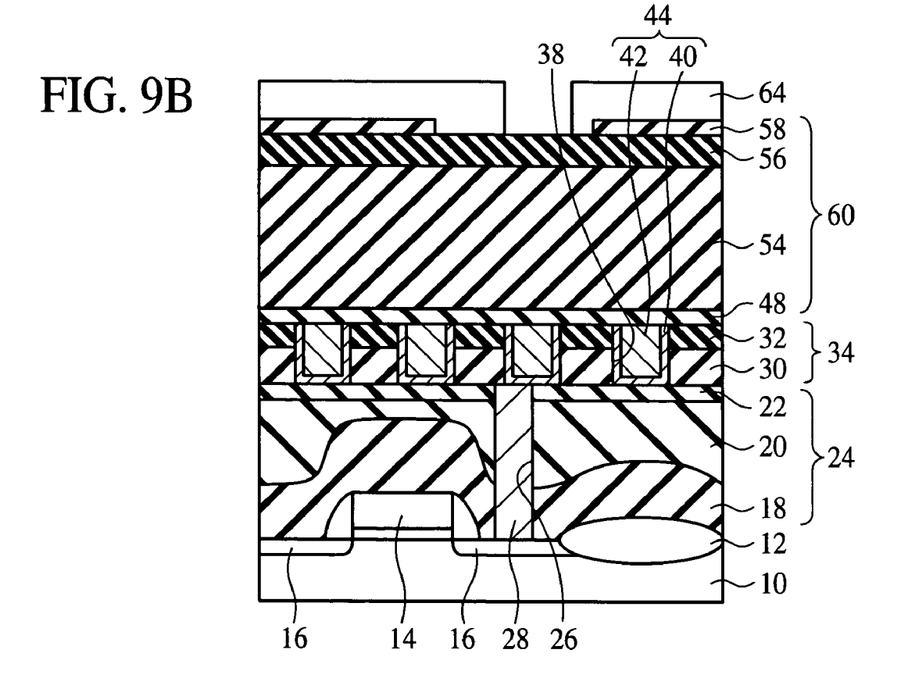

Next, a photoresist film 64 for exposing a region for a via hole to be formed in is formed by photolithography on the silicon oxide film 56 exposed by etching the silicon nitride film 58 and the silicon nitride film 58 (see FIG. 9B).

Figure 10A:
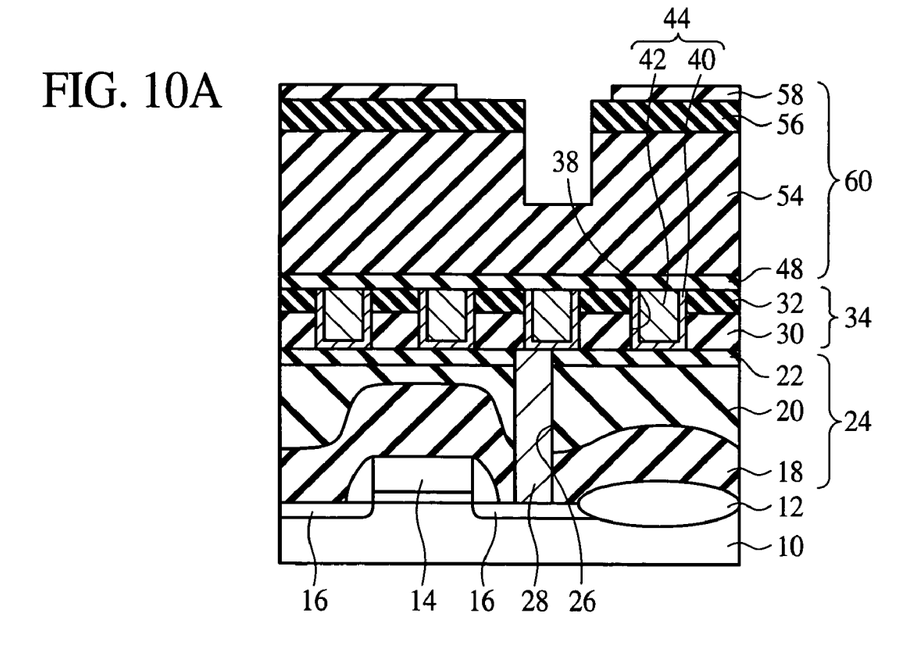
FIGS. 10A-10B are sectional views of the semiconductor device in the steps of the method for fabricating the semiconductor device according to the embodiment of the present invention (Part 6).

Then, with the photoresist film 64 as a mask, the silicon oxide film 56 and the SiOC film 54 are etched. In this etching, the etching period of time is adjusted so that the etching stops near the center of the SiOC film 54. After the etching has been finished, the photoresist film 64 used as the mask is removed (see. FIG. 10A).

Then, with the silicon nitride film 58 as a hard mask, the silicon oxide film 56, the SiOC film 54 and the SiC film 48 are etched. Thus, a via hole 66 for burying a via part of the interconnection layer is formed in the SiOC film 54 and the SiC film 48, and an interconnection groove (trench) 68 for burying the interconnection layer is formed in the silicon oxide film 56 and the SiOC film 54 in the region containing the via hole 66 (see FIG. 10B).

Figure 10B:
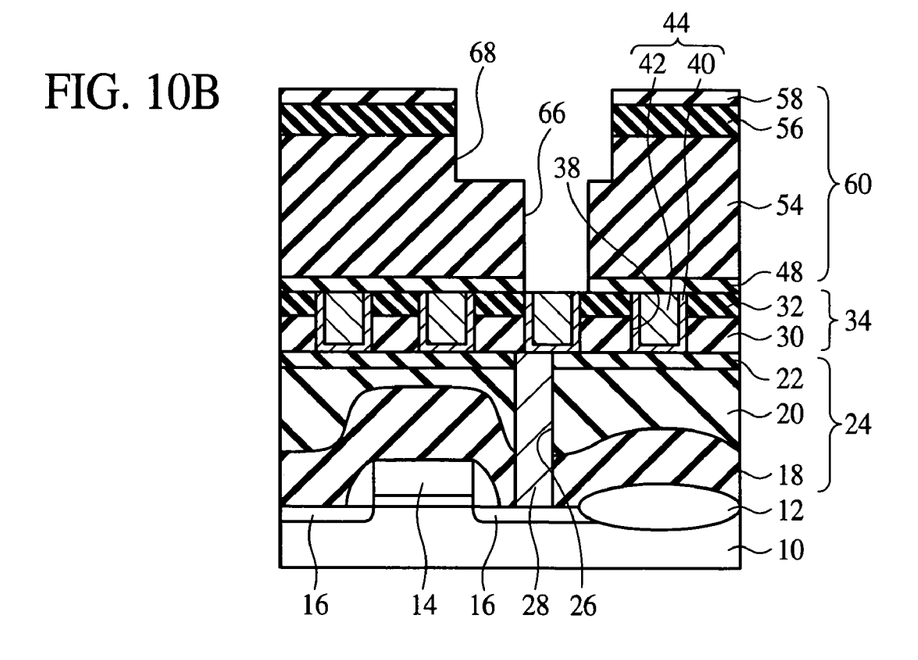

Next, a barrier metal layer 70 of TaN film of, e.g., a 30 nm-thickness and a Cu film of, e.g., a 30 nm-thickness are continuously deposited on the entire surface by, e.g., sputtering.

Figure 11A:
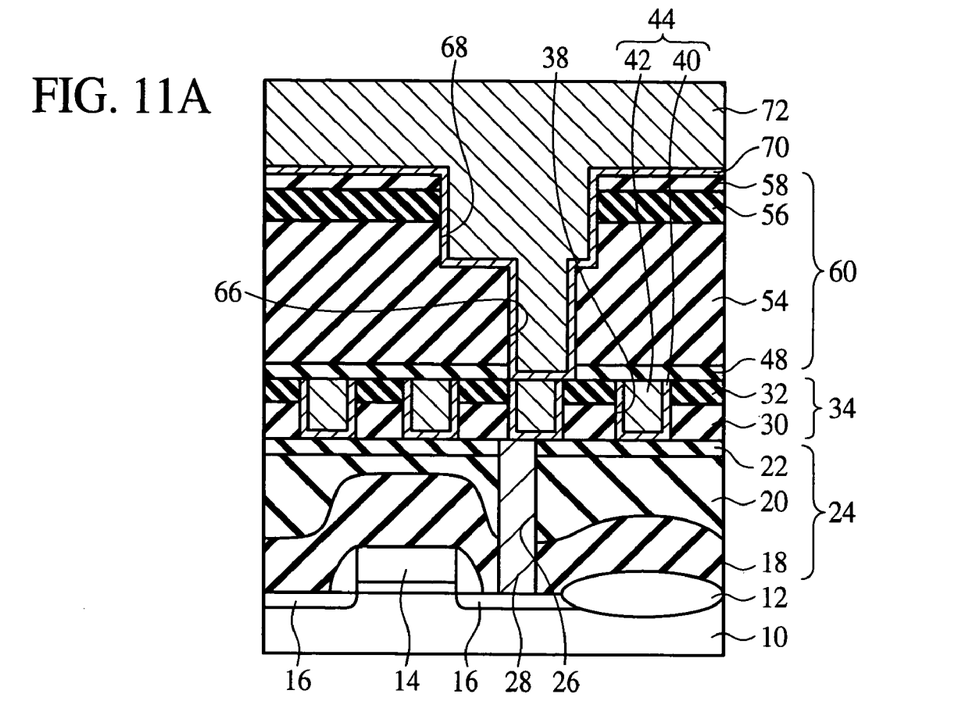
FIGS. 11A-11B are sectional views of the semiconductor device in the steps of the method for fabricating a semiconductor device according to the embodiment of the present invention (Part 7).
Figure 11B:
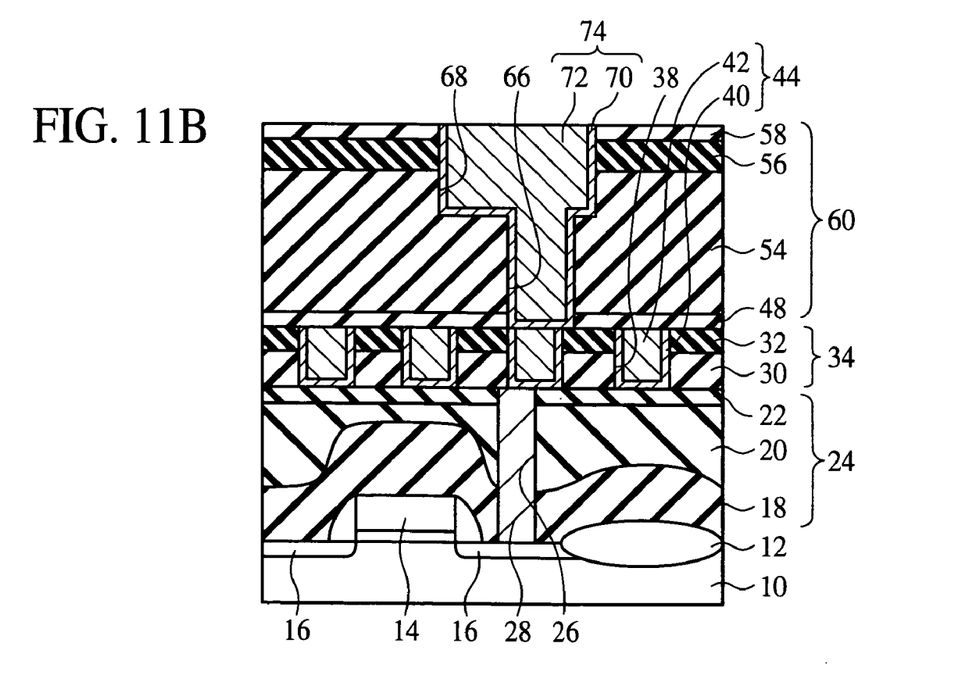

Then, with the Cu film formed on the barrier metal layer 70 as a seed, a Cu film is further deposited by electrolytic plating to form a Cu film 72 of, e.g., a 1 μm-total thickness (see FIG. 11A).

Next, the Cu film 72 and the barrier metal layer 70 of the TaN film are polished by CMP until the silicon nitride film 58 is exposed to remove the Cu film 72 and the barrier metal layer 70 on the silicon nitride film 58. Thus, an interconnection layer 74 is formed of the barrier metal layer 70 of the TaN film for preventing the diffusion of the Cu and the Cu film 72 forming the major part of the interconnection layer, buried in the via hole 66 and the interconnection groove 68 (see FIG. 11B).

Figure 12A:
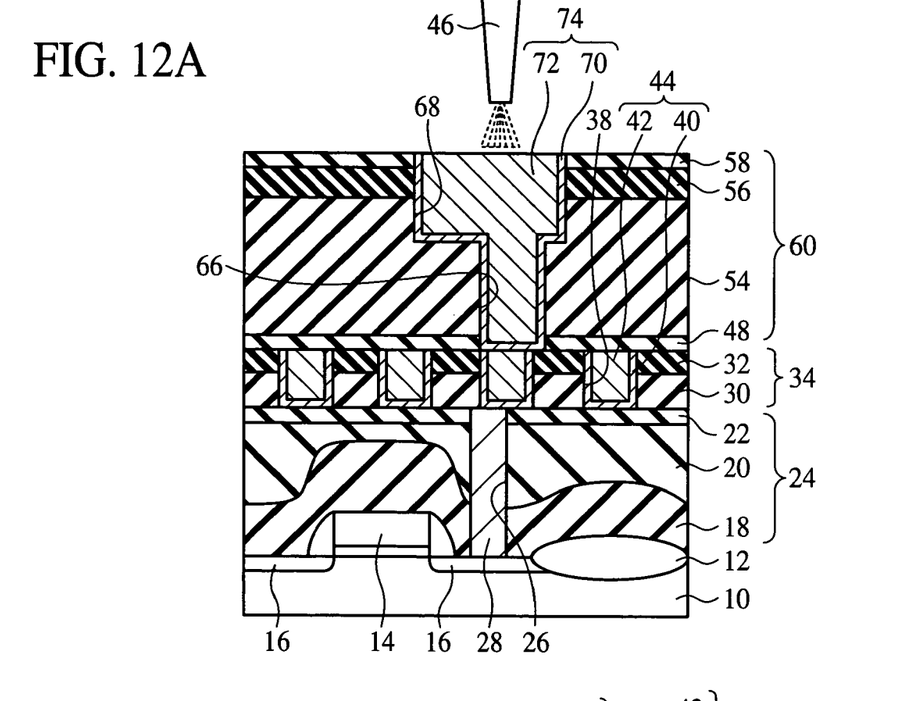
FIGS. 12A-12B are sectional views of the semiconductor device in the steps of the method for fabricating a semiconductor device according to the embodiment of the present invention (Part 8).

After the interconnection layer 74 has been buried by CMP, in the same way as in forming the interconnection layer 44, the nitrogen-two-fluid processing of concurrently injecting nitrogen gas and water to the surface of the inter-layer insulation film 60 and the surface of the interconnection layer 74 is performed (see FIG. 12A). The nitrogen-two-fluid processing can suppress the migration of the Cu atoms in the interconnection layer 74 as well in high temperature environments, and can suppress the generation of voids in the interconnection layer 74. Resultantly, the generation of conduction defects of the interconnection layer 74 can be suppressed.

After the nitrogen-two-fluid processing, in the same way as in forming the interconnection layer 44, hydrogen plasmas are applied to the surface of the inter-layer insulation film 60 and the surface of the interconnection 74. The application of hydrogen plasmas purifies the surface of the inter-layer insulation film 60 and the surface of the interconnection layer 74, and the diffusion preventing film can be formed on the inter-layer insulation film 60 and the interconnection layer 74 with high adhesion. Thus, the semiconductor device can have increased reliability.

Figure 12B:
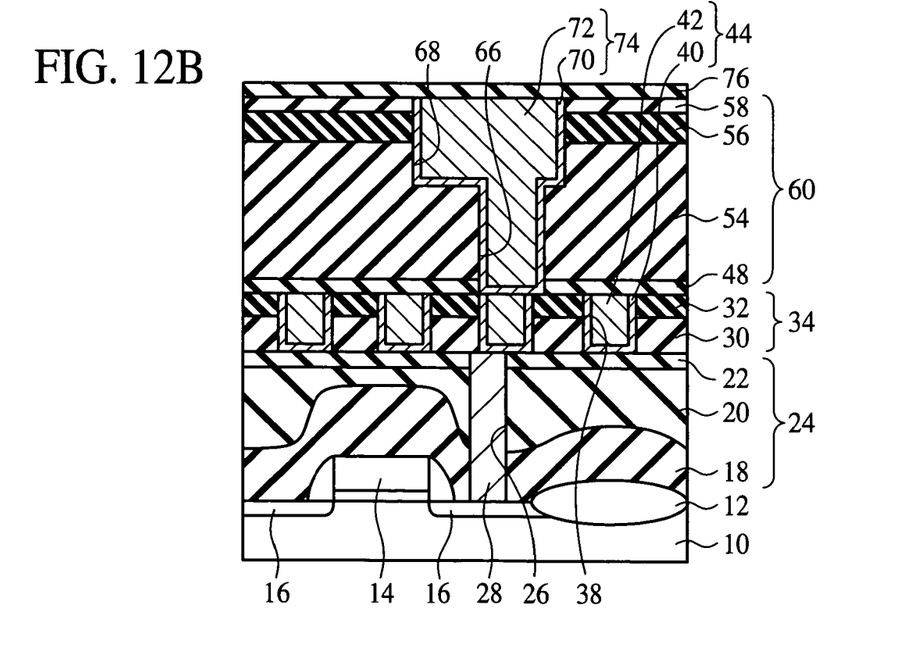

After the application of hydrogen plasmas, an SiC film 76 of, e.g., a 50 nm-thickness is formed on the inter-layer insulation film 60 and the interconnection layer 74 by, e.g., plasma CVD (se FIG. 12B). The SiC film 76 functions as the diffusion preventing film for preventing the diffusion of the Cu as the interconnection layer material.

Hereafter, the same steps as shown in FIGS. 8A-8B, 9A-9B, 10A-10B, 11A-11B and 12A-12B are repeated to form a multilayer interconnection structure of a plurality of interconnection layers on the silicon substrate 10 with the MOS transistor formed on.

As described above, according to the present embodiment, after the TaN film and the Cu film to be the interconnection layer have been buried in the openings, such as the interconnection groove, the via hole, etc. in the inter-layer insulation film and flattened and before the SiC film functioning as the diffusion preventing film for preventing the diffusion of Cu as the interconnection material is formed, the nitrogen-two-fluid processing of concurrently injecting nitrogen gas and water to the surface of the interconnection layer is performed, whereby the migration of the Cu atoms of the interconnection layer in high temperature environments can be suppressed, and the generation of voids in the interconnection layer can be suppressed. Accordingly, the method for fabricating a semiconductor device according to the present embodiment can provide semiconductor devices including interconnection layers of good stress-migration resistance and high reliability.

According to the present embodiment, after the nitrogen-two-fluid processing, hydrogen plasmas are applied to the surface of the inter-layer insulation film and the surface of the interconnection layer, whereby the surface of the inter-layer insulation film and the surface of the interconnection layer are cleaned, and the SiC film functioning the diffusion preventing film for preventing the diffusion of Cu as the interconnection material can be formed with high adhesion. Thus, the semiconductor device can have increased reliability.

(Evaluation Result)

Then, the evaluation result of the method for fabricating a semiconductor device according to the present embodiment will be explained. Semiconductor devices having the multilayer interconnection structure which have been fabricated by the method for fabricating a semiconductor device according to the present embodiment were subjected to a high temperature shelf test to measure the rate of generating conduction defects.

The high temperature shelf tests were made on semiconductor devices including five interconnection layers and an electrode pad of aluminum formed with a silicon oxide film as an inter-layer insulation film. In Example 1, the nitrogen-two-fluid processing was performed for 30 seconds, and in Example 2, the nitrogen-two-fluid processing was performed for 60 seconds. In both Examples 1 and 2, in the nitrogen-two-fluid processing, carbonated water of a 0.2 MΩ·cm specific resistance is used as the water to be concurrently injected together with nitrogen gas, the flow rate of the carbonated water was 150 mL/min, and the flow rate of the nitrogen gas was 50 L/min.

In the high temperature self tests, the temperature at which the semiconductor device stood was 200° C., and the periods of time for the semiconductor device stood were 70 hours, 170 hours, 340 hours and 500 hours. The rate of the generation of conduction defects were measured in each case.

As controls, the same high temperature shelf tests were made on the following cases without the nitrogen-two-fluid processing. In Control 1, an interconnection layer is buried in an interconnection groove and is flattened by CMP, and then immediately a diffusion preventing film was formed. In Control 2, an interconnection layer was buried in an interconnection groove and was flattened by CMP, water jet processing of injecting carbonated water of a 0.2 MΩ·cm specific resistance at a 150 mL/min flow rate and a 15 kgf/cm² injection pressure was performed, and then a diffusion preventing film was formed. In Control 3, an interconnection layer was buried in an interconnection groove and flattened by CMP, ammonia plasma processing was performed, and then a diffusion preventing film was formed. In all Controls 1 to 3, the semiconductor devices were fabricated in the same was as in Examples 1 and 2 except that in the former, the nitrogen-two-fluid processing was not performed, and the prescribed processing was performed instead.

The results of the high temperature shelf tests on Control 1, Example 1, Example 2, Control 2 and Control 3 are as follows.

In Control 1, the generation rate of conduction defects were 8%, 27%, 46% and 52% respectively for the standing periods of time of 70 hours, 170 hours, 340 hours and 500 hours.

In Example 1, the generation rate of conduction defects were 1%, 5%, 11% and 16% respectively for the standing periods of time of 70 hours, 170 hours, 340 hours and 500 hours.

In Example 2, the generation rate of conduction defects were 0% respectively for the standing periods of time of 70 hours, 170 hours, 340 hours and 500 hours.

In Control 3, the generation rate of conduction defects were 10%, 20%, 35% and 60% respectively for the standing periods of time of 70 hours, 170 hours, 340 hours and 500 hours.

Based on the result of the high temperature shelf tests described above, it has been confirmed that the method for fabricating a semiconductor device according to the present embodiment can much drastically decrease the generation rate of conduction defects in high temperature environments in comparison with the conventional methods. In comparison with the result of Example 1 with that of Example 2, it is found that Example 2 in which the processing period of time of the nitrogen-two-fluid processing is longer, can further decrease the generation rate of conduction defects.

MODIFIED EMBODIMENTS

The present invention is not limited to the above-described embodiment and can cover other various modifications.

For example, in the above-described embodiment, the inter-layer insulation films are formed of SiOC film, silicon oxide film, etc. However, the inter-layer insulation films are not essentially formed of these films and can be various insulation films.

In the above-described embodiment, the diffusion preventing film for preventing the diffusion of Cu as the interconnection material is SiC film. The diffusion preventing film for Cu is not essentially SiC film. As the diffusion preventing film for Cu, silicon nitride film, polyimide film, zirconium nitride film, etc., for examples, other than SiC film may be used.

In the above-described embodiment, in forming the interconnection layer 74, the TaN film 70 and the Cu film 72 are simultaneously buried in the via hole 66 and the interconnection groove 68 by the dual damascene process. However, it is possible that the via hole and the interconnection groove are formed separately and the TaN film and Cu film are buried in the via hole and the interconnection groove separately, using by the single damascene process.

What is claimed is:

1. A method for fabricating a semiconductor device comprising the steps of:
   forming an opening in an insulation film;
   forming an interconnection layer of Cu as a main material in the opening; and
   concurrently spraying nitrogen gas and water in a liquid phase on the surface of the interconnection layer buried in the opening, the nitrogen being adsorbed onto the surface of the interconnection layer, wherein the water to be concurrently injected with nitrogen gas is carbonated water or ozonized water.

2. A method for fabricating a semiconductor device according to claim 1, further comprising, after the step of concurrently spraying the nitrogen gas and the water, the step of
   forming a diffusion preventing film for preventing the diffusion of the Cu on the insulation film and the interconnection layer.

3. A method for fabricating a semiconductor device according to claim 2, wherein
   the diffusion preventing film is an SiC film or a silicon nitride film.

4. A method for fabricating a semiconductor device according to claim 3, further comprising, after the step of concurrently spraying the nitrogen gas and the water, the step of
   applying hydrogen plasmas to the surface of the insulation film and the surface of the interconnection layer.

5. A method for fabricating a semiconductor device according to claim 3, wherein
   in the step of forming the opening, the opening containing a via hole and an interconnection trench formed in a region containing the via hole is formed.

6. A method for fabricating a semiconductor device according to claim 2, further comprising, after the step of concurrently spraying the nitrogen gas and the water, the step of
   applying hydrogen plasmas to the surface of the insulation film and the surface of the interconnection layer.

7. A method for fabricating a semiconductor device according to claim 2, wherein
   in the step of forming the opening, the opening containing a via hole and an interconnection trench formed in a region containing the via hole is formed.

8. A method for fabricating a semiconductor device according to claim 1, further comprising, after the step of concurrently spraying the nitrogen gas and the water, the step of
   applying hydrogen plasmas to the surface of the insulation film and the surface of the interconnection layer.

9. A method for fabricating a semiconductor device according to claim 8, wherein
   in the step of forming the opening, the opening containing a via hole and an interconnection trench formed in a region containing the via hole is formed.

10. A method for fabricating a semiconductor device according to claim 1, wherein
   in the step of forming the opening, the opening containing a via hole and an interconnection trench formed in a region containing the via hole is formed.

* * * * *